United States Patent

Beurrier et al.

[15] 3,638,134

[45] Jan. 25, 1972

[54] REFLECTIONLESS AMPLIFIER

[72] Inventors: Henry R. Beurrier, Chester Township, Morris County; Harold Seidel, Warren, both of N.J.

[73] Assignee: Bell Telephone Laboratories, Incorporated, Murray Hill, N.J.

[22] Filed: Nov. 26, 1969

[21] Appl. No.: 880,016

[52] U.S. Cl. ....................330/149, 330/107

[51] Int. Cl. ....................H03f 1/26

[58] Field of Search ....................330/85, 103, 107, 149

[56] References Cited

UNITED STATES PATENTS 3,191,128 6/1965 Lamont ....................330/103

3,356,959 12/1967 Vilkomerson....................330/85 X

*Primary Examiner*—John Kominski

*Assistant Examiner*—Lawrence J. Dahl

*Attorney*—R. J. Guenther and Arthur J. Torsiglieri

[57] ABSTRACT

An impedance match at the external terminals of an amplifier are simulated by cancelling any component of the signal wave reflected by the amplifier. At the input terminal of the amplifier, the cancelling wave is obtained by sampling the amplified signal and directionally coupling a portion thereof into the amplifier input network in a direction away from the amplifier. At the amplifier output terminal, the cancelling wave is obtained by sampling any wave reflected back towards the amplifier, and injecting a portion of this wave into the input end of the amplifier.

11 Claims, 6 Drawing Figures

INVENTORS H. R. BEURRIER
H. SEIDEL
BY
Sylvan Sherman
ATTORNEY

REFLECTIONLESS AMPLIFIER

This invention relates to the techniques and circuits for rendering amplifiers reflectionless.

BACKGROUND OF THE INVENTION

It is a very common practice to employ amplifiers whose input and output impedances are significantly different than the impedances of the circuits to which they are connected. For example, an emitter follower transistor amplifier has, ideally, an infinite input impedance and zero output impedance. The transmission lines to which it is connected, on the other hand, may have an impedance of only 50 ohms. A problem in such a situation arises when there is a mismatch somewhere in the system which causes a component of the signal to be reflected back towards the amplifier. Because of the large mismatch at the output terminal of the amplifier, this reflected component will, in turn, be re-reflected, causing echoes in the system and delay distortion effects.

It is, accordingly, the broad object of the present invention to simulate an impedance match by suppressing reflections from the terminals of an amplifier while fully preserving all the preferred characteristics of the amplifier.

SUMMARY OF THE INVENTION

In accordance with the present invention, an impedance match at the terminals of an amplifier is simulated by cancelling any component of the signal wave reflected by the amplifier. At the input terminal of the amplifier, the cancelling wave is obtained by sampling the amplified output signal and directionally coupling a portion thereof back into the amplifier input network so as to propagate in a direction away from the amplifier. At the amplifier output terminal, the cancelling wave is obtained by sampling any wave reflected back towards the amplifier and injecting a portion of this wave into the input end of the amplifier.

In both instances, the amplifier to be rendered reflectionless is used in a reflex configuration, thereby eliminating the need for any auxiliary amplifiers.

It is an advantage of the invention that while the circuits appear to be feedback circuits, they are, in fact, in the nature of feed forward circuits. As such, they can operate over an unlimited frequency range without any stability problems. It is a further advantage of the invention that the impedance-matching process in no way intrudes upon or degenerates any of the preferred characteristics of the amplifier. Thus, the reflex-match technique described herein can be incorporated into any amplifier configuration without in any way impairing its gain, bandwidth, stability or any other of its design characteristics. These and other objects and advantages, the nature of the present invention, and its various features, will appear more fully upon consideration of the various illustrative embodiments now to be described in detail in connection with the accompanying drawings.

DETAILED DESCRIPTION

Figure 1:
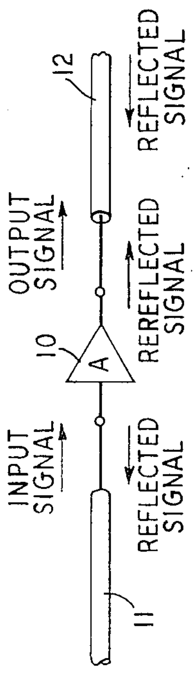
FIG. 1 (PRIOR ART)
FIG. 1, included for purposes of explanation, shows an amplifier disposed between two sections of transmission line.

Referring to the drawings, FIG. 1, included for purposes of explanation, shows a typical circuit situation comprising an amplifier 10 disposed between two sections of transmission lines 11 and 12. The amplifier might have an input impedance of the order of tens of thousands of ohms, and an output impedance of hundreds of thousands of ohms. The transmission lines, on the other hand, typically have an impedance of the order of 50 ohms. It is thus clear that there is a large mismatch at both the input and output terminals of amplifier 10. As such, there will be a large reflected wave produced at the input terminal of the amplifier. Similarly, any discontinuities along line 12 will reflect a portion of the output signal back towards amplifier 10. This reflected wave will, in turn, be re-reflected at the output terminal of the amplifier. Since these reflected and re-reflected waves introduce delay distortion effects and echoes in the system, they are clearly undesirable.

Figure 2:
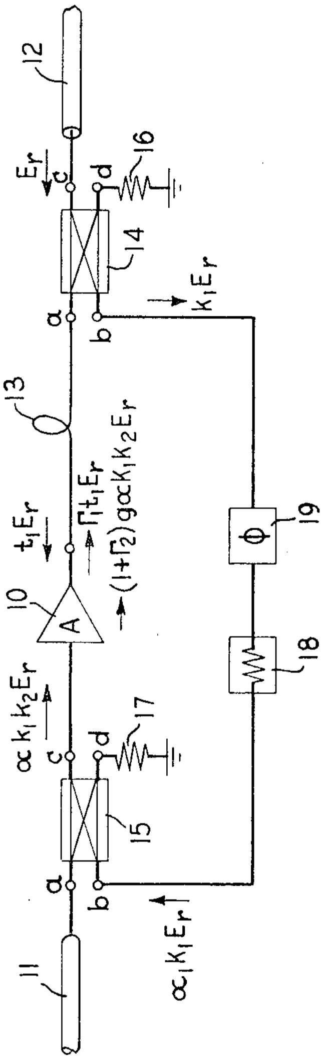
FIGS. 2 and 3 show, in block diagram, the amplifier circuit of FIG. 1 modified, in accordance with the present invention, to cancel reflections at the output and input terminals of the amplifier, respectively.

FIG. 2 shows a first embodiment of the invention for suppressing reflections at the output end of an amplifier. Using the same identification numerals as in FIG. 1 for corresponding components, the embodiment of FIG. 2 includes an amplifier 10 disposed between sections of transmission lines 11 and 12. In accordance with the invention, however, a time delay network 13 and a directional coupler 13 are interposed between amplifier 10 and line section 12.

Delay network 13 introduces a time delay $\tau$ for reasons which will be explained more fully hereinbelow. Directional coupler 14, which can be either a quadrature coupler or an in-phase coupler, depending upon the bandwidth of interest, is so connected as to sense the presence of any wave propagating towards amplifier 10, and to couple a portion of this (reflected) wave to the input terminal of the amplifier. This coupling can be realized by means of a second coupler 15 located in the amplifier input signal wavepath.

Designating the two pairs of conjugate ports of couplers 14 and 15 as *a–b* and *c–d*, the amplifier output is coupled, through delay network 13, to port *a* of coupler 14. Transmission line 12 is coupled to port *c* of coupler 14. Similarly, the input signal is coupled to port *a* of coupler 15, while the amplifier input terminal is coupled to port *c*. Port *b* of coupler 14 is coupled to port *b* of coupler 15, while port *d* of both couplers are match-terminated by means of terminations 16 and 17. An attenuator 18 and a phase shifter 19 can, if required, be included in the wavepath connecting couplers 14 and 15.

In operation, an input signal is coupled to amplifier 10 through coupler 15. A small portion is also coupled to port *d* of coupler 15 and is dissipated in termination 17. Since ports *a* and *b* are conjugate ports, substantially none of the incident input signal is coupled to port *b*.

The signal is amplified in the usual manner in amplifier 10, and the amplified signal coupled through coupler 14 to line 12.

If no impedance discontinuities are encountered by the output wave, all the energy coupled from amplifier 10 to line 12 would propagate away from the amplifier and there would be no need for any reflection suppressing arrangement. More generally, however, this is not the case and a portion of the output signal will typically be reflected back towards amplifier 10. If this occurs in the absence of an impedance match at amplifier 10, the reflected wave will be re-reflected by the amplifier back towards line 12 as an undesired echo of the original signal. Depending upon the magnitudes of the impedance mismatches, this process of reflection and re-reflection will continue, causing additional spurious signals.

To suppress this effect, directional coupler 14 senses the presence of any reflected signal and couples a small portion of it to the input terminal of amplifier 10. Designating the magnitude of the reflected wave as $E_r$, coupler 14 divides the latter into two components, $t_1E_r$ and $k_1E_r$, where $k_1$ and $t_1$ are the coefficients of transmission and coupling of coupler 14. The first component propagates through the delay network to amplifier 10 where it is re-reflected. The magnitude of the re-reflected wave is given by $\Gamma_1 t_1 E_r$, where $\Gamma_1$ is the coefficient of reflection of the amplifier.

Component $k_1E_r$ propagates through phase shifter 19 and attenuator 18 to port *b* of coupler 15 where it is divided into two components $\alpha_1k_1k_2E_r$ and $\alpha_1k_1t_2E_r$, where $\alpha$ is the attenuation factor introduced by attenuator 18, and $t_2$ and $k_2$ are the coefficients of transmission and coupling of coupler 15. Component $\alpha_1k_1t_2E_r$, appearing at port *d* of coupler 15 is dissipated in termination 17. Component $\alpha_1k_1k_2E_r$, appearing at the input of the amplifier 10. This voltage is amplified, producing an output wave $(1+\Gamma_2)g\alpha_1k_1k_2E_r$, where *g* is the amplifier voltage gain factor, and $\Gamma_2$ is the coefficient of reflection at the amplifier input terminal. Cancellation occurs when the wave amplitudes are equal. That is, when $$|\Gamma_1 t_1 E_r| = |(1+\Gamma_2)g\alpha_1 k_1 k_2 E_r| \quad (1)$$

or $$\left|\frac{t_1}{k_1}\cdot\frac{1}{k_2}\right| = \left|\frac{(1+\Gamma_2)}{\Gamma_1}\cdot g\alpha_1\right| \quad (2)$$

and, in addition, the waves are 180° out of phase. For a given amplifier, having a prescribed gain and reflection factor, the parameters of the attenuator and couplers are selected to satisfy equation (2). The phase relationship is satisfied by means of delay network 13 which is adjusted to introduce sufficient time delay to compensate for any differential time delay experienced by the two signal components. Any additional phase adjustment is provided, when required, by phase shifter 19. This will depend primarily on the phase characteristic of the amplifier.

Thus it is seen that the re-reflected wave and the amplified portion of the reflected wave can be made to cancel. The net effect of this cancellation is to render the amplifier reflectionless by suppressing any re-reflection at its output terminal. As a result the amplifier now appears to be impedance-matched at its output terminal.

Figure 3:
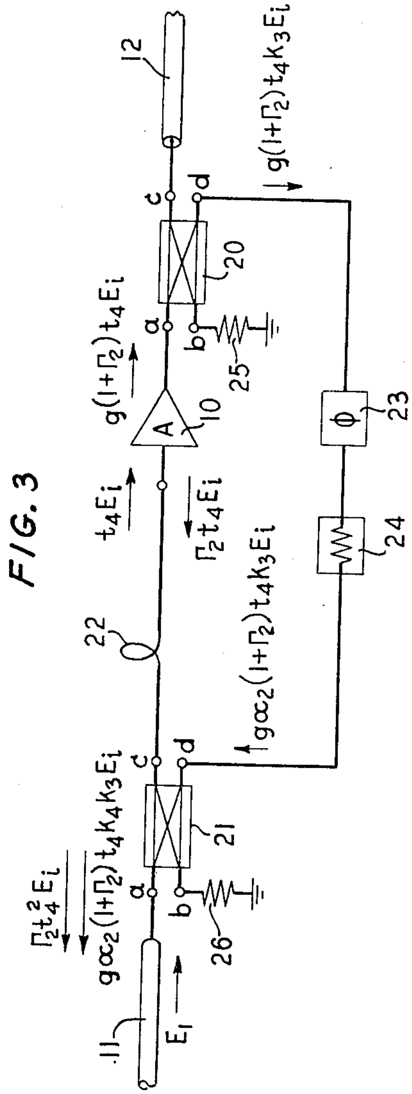

FIG. 3 shows a reflex arrangement, in accordance with the present invention, for suppressing reflections at the input end of the amplifier. Using, as before, the same identification numerals as in FIG. 1 for corresponding components, the embodiment of FIG. 3 includes an amplifier 10 disposed between sections of transmission lines 11 and 12. The output from the amplifier is connected to line 12 by means of a directional coupler 20 which senses the amplified output wave and couples a portion of it to a second directional coupler 21 which is located between line 11 and the input end of amplifier 10. A delay network 22 is disposed between coupler 21 and the amplifier. As above, an attenuator 24 and a phase shifter 23 can be included, if required, in the wavepath connecting coupler 20 and 21.

Designating the two pairs of conjugate ports of couplers 20 and 21 as *a–b* and *c–d*, the output terminal of amplifier 10 is, more specifically, connected to port *a* of coupler 20. Port *c* is connected to line 12; port *b* is resistively terminated by means of termination 25; and port *d* is connected through phase shifter 23 and attenuator 24 to port *d* of coupler 21. Port *c* of coupler 21 is connected to the input terminal of the amplifier through delay network 22; port *a* is connected to line 11; and port *b* is resistively terminated by termination 26.

In operation, an input signal $E_i$, applied to port *a* of coupler 21, is divided into two components, $t_4E_i$ at port *c* and $k_4E_i$ at port *d*. Most of the latter component is coupled to port *b* of coupler 20 and dissipated in termination 25. Component $t_4E_i$, on the other hand, is coupled through delay network 22 and is incident upon the input terminal of amplifier. Because the latter is not matched to the transmission line, a reflected wave $\Gamma_2t_4E_i$ is produced, where $\Gamma_2$ is the coefficient of reflection at the input to the amplifier. The amplifier, which responds to the voltage applied at its input, produces an amplified output signal $g(1+\Gamma_2)t_4E_i$. A portion of this signal, $g(1+\Gamma_2)k_3t_4E_i$, is coupled through phase shifter 23 and attenuator 24 to port *d* of coupler 21. The amplitude of the signal at port *d* is given by $g\alpha_2(1+\Gamma_2)k_3t_4E_i$, where $k_3$ is the coefficient of coupling of coupler 20, and $\alpha_2$ is the coefficient of attenuation of attenuator 24.

The signal applied to port *d* is divided into two components. One component is dissipated in termination 26 connected to port *b*. The other component, whose amplitude is given by $g\alpha_2(1+\Gamma_2)t_4k_4k_3E_i$ is coupled to line 11 through port *a*. In addition, a component $\Gamma_2t_4^2E_i$ of reflected wave $\Gamma_2t_4E_i$ is also coupled to line 11 through port *a*. Cancellation of the reflected wave occurs when $$|g\alpha_2(1+\Gamma_2)t_4k_4k_3E_i| = |\Gamma_2t_4^2E_i| \quad (3)$$

$$\left|\frac{k_4}{t_4}\cdot k_3\right| = \left|\frac{\Gamma_2}{1+\Gamma_2}\cdot\frac{1}{gd_2}\right| \quad (4)$$

and, in addition, the two waves are 180° out of phase.

For a given amplifier, having a given gain and reflection factors, the parameters of the attenuator and the couplers are selected to satisfy equation (4). The phase relationship is satisfied by means of delay network 22, which is designed to introduce sufficient time delay to compensate for any differential time delay experienced by the two wave components. Where required, any phase offset is provided by phase shifter 23.

It may appear that the reflex-match networks of FIG. 2 and FIG. 3 are feedback networks. It will be noted, however, that in the embodiment of FIG. 2, it is not a component of the output signal that is fed back to the input of amplifier 10, but rather a component of a reflected wave that is fed back. Similarly, while it is the amplifier output signal that is sampled in the embodiment of FIG. 3, it will be noted that the sampled signal is not fed back to the amplifier input, but rather is injected into the amplifier input wavepath so as to propagate in a direction away from the amplifier. Thus, neither of these circuits is a feedback circuit, as that term is commonly used and understood. Hence, these circuits are not subject to any of the usual limitations and problems associated with feedback circuits.

Figure 4:
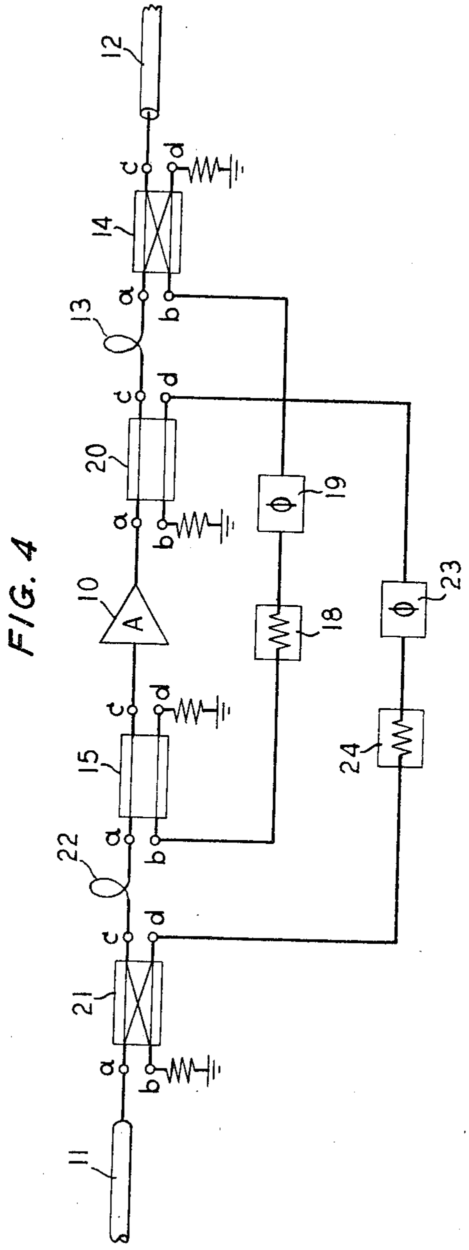
FIG. 4 shows the amplifier of FIG. 1 modified in accordance with the circuits of FIGS. 2 and 3 to cancel reflections at both the input and output terminals of the amplifier.

FIG. 4, which shows an amplifier that has been rendered reflectionless at both its input and output terminals, is derived by combining the reflex-match networks of FIGS. 2 and 3. Using, once again, the same identification numerals for common components, the network comprises amplifier 10 disposed between transmission line sections 11 and 12. At the input end of the amplifier, line 11 is coupled to amplifier 10 through coupler 21, delay network 22 and coupler 15. At the output end, amplifier 10 is coupled to line 12 by means of coupler 20, delay network 13 and coupler 14.

As in the embodiment of FIG. 2, port *b* of coupler 14 is connected to port *b* of coupler 15 by means of a wavepath which includes an attenuator 18 and, optionally, a phase shifter 19. This portion of the network, along with delay network 13 simulates an impedance match at the amplifier output terminal for the reasons explained hereinabove in connection with FIG. 2.

As in the embodiment of FIG. 3, port *d* of coupler 20 is connected to port *d* of coupler 21 by means of a wavepath which includes an attenuator 24 and, optionally, a phase shifter 23. This portion of the network, along with delay network 22, simulates an impedance match at the amplifier input terminal for the reasons explained hereinabove in connection with FIG. 3.

Figure 5:
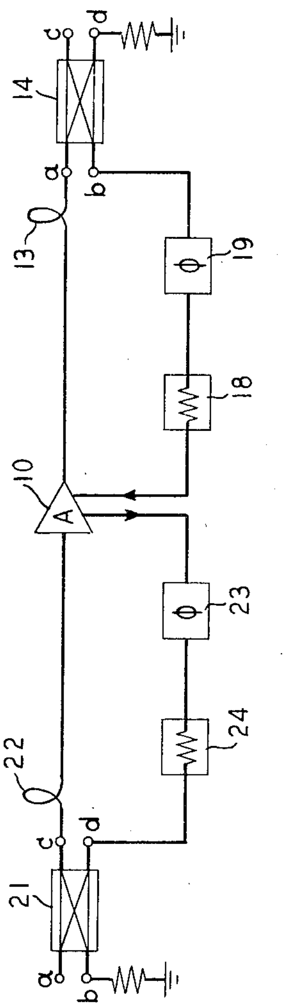
FIG. 5 shows an alternate embodiment of the reflex-match amplifier of FIG. 4.

In various embodiments described thus far, all connections are made external to the amplifier, and directional couplers are employed throughout. This, typically, would be the preferred way of modifying existing amplifiers. If, however, it is convenient to make connections within the amplifier itself, two of the directional couplers can be omitted in favor of simple voltage taps. This is illustrated in the embodiment of FIG. 5, which is a modification of the network shown in FIG. 4. More specifically, in this embodiment, coupler 15 has been omitted and the reflected signal is fed directly into amplifier 10 at some appropriate point. Similarly, coupler 20 has been omitted and a portion of the amplified signal is extracted from a point within the amplifier by means of a simple voltage tap. As indicated above, this can be done by designing the matching networks directly into the amplifier, or, where feasible, by modifying existing amplifiers.

Figure 6:
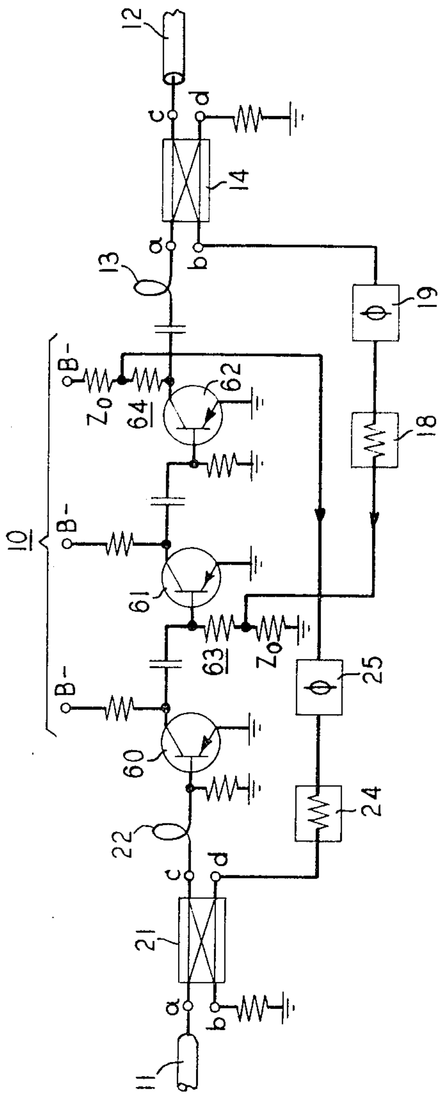
FIG. 6 shows a three stage reflex-match transistor amplifier illustrative of the embodiment of the invention shown in FIG. 5.

FIG. 6 illustrates a specific amplifier and the manner in which internal connections can be made. For purposes of illustration, amplifier 10 is depicted as a three stage, R–C coupled transistor amplifier, in which bias considerations have been omitted. Port *b* of coupler 14 is coupler to a tap on the base resistor 63 of middle transistor 61. In a transmission system having a characteristic impedance $Z_o$, the tap is advantageously made at a point along resistor 63 equal to $Z_o$ so that port *b* of coupler 14 is match-terminated. The signal thus injected into amplifier 10 undergoes two stages of amplification.

Similarly, port *d* of coupler 21 is connected to a tap on the collector resistor 64 of the output transistor 62. Preferably the tap is also made at a point along resistor 64 so as to match-terminate port *d* of coupler 21. The portion of the amplifier output signal thus extracted, is coupled out of amplifier 10 and directionally injected into line 11 so as to propagate in a direction away from the amplifier, and to cancel the wave reflected by the amplifier input terminal.

As indicated hereinabove, the terminal impedances of most amplifiers are usually so much larger or smaller than the transmission line impedance that the coefficients of reflection $\Gamma_1$ and $\Gamma_2$ are usually close to $\pm 1$, and can be considered constant over the frequency range of interest. If, however, $\Gamma_1$ and $\Gamma_2$ vary over the operating range, it follows from equations (2) and (4) that the coupler coefficients *t* and *k* must also vary correspondingly in order to maintain the equality. This can be readily done by tapering the coupler characteristic, or by disposing suitable networks in the signal paths.

It will also be recognized that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

We claim:

1. An electromagnetic wave system including:
an amplifier whose output terminal is coupled to a load;
means for suppressing reflections from the output terminal of said amplifier comprising:
means for sensing a wave propagating in the direction from said load towards said amplifier output terminal;
means for coupling a portion of said wave from said sensing means to the input of said amplifier;
characterized in that:
said coupled portion is amplified by said amplifier;
and in that the amplified coupled portion of said wave is equal in amplitude and is 180° out of phase with wave energy reflected at the output terminal of said amplifier.

2. The system according to claim 1 wherein said sensing means is a quadrature coupler.

3. The system according to claim 1 including a delay network disposed between said amplifier and said sensing means.

4. The system according to claim 1 including means for adjusting the amplitude and phase of said wave portion.

5. An electromagnetic wave system including:
an amplifier whose input terminal is coupled to a signal source;
means for suppressing reflections from the input terminal of said amplifier comprising:
means for directionally coupling back towards said signal source a portion of the signal wave amplified by said amplifier, said portion being equal in amplitude and 180° out of phase with wave energy reflected at the input terminal of said amplifier.

6. The system according to claim 5 including a delay network disposed between said signal source and said amplifier.

7. The system according to claim 5 including means for adjusting the amplitude and phase of said coupled portion of signal wave.

8. A reflex-match amplifier comprising:
an amplifier;
a signal source;
and an output load;
means for coupling said source to the input terminal of said amplifier including, in cascade, a first directional coupler and a first delay network;
means for coupling the output terminal of said amplifier to said load including, in cascade, a second delay network and a second directional coupler;
means connected to said second coupler for injecting a portion of reflected wave propagation in a direction from said output load towards said amplifier into the input end of said amplifier to cancel any of said reflected wave that is re-reflected at the output terminal of said amplifier;
means for extracting a component signal wave amplified by said amplifier;
and means for coupling said component of wave to said first coupler to cancel any input signal wave reflected at the input terminal of said amplifier.

9. The reflex-match amplifier according to claim 8 wherein:
said amplifier comprises a plurality of cascaded active elements;
said portion of wave is injected into the input end of one of said elements;
and wherein said component of amplified signal wave is extracted from the output end of one of said elements.

10. The reflex-match amplifier according to claim 8 wherein:
said portion of reflected wave is injected into the input end of said amplifier by means of a directional coupler;
and wherein said component of amplified signal wave is extracted from the output end of said amplifier by means of a directional coupler.

11. An electromagnetic wave transmission system comprising:
a first transmission line;
an amplifier;
and a second transmission line;
means for coupling said first line to the input terminal of said amplifier including, in cascade, a first directional coupler, a first delay network, and a second directional coupler;
means for coupling the output end of said amplifier to said second transmission line including, in cascade, a third directional coupler, a second delay network, and a fourth directional coupler;
each of said couplers having two pair of conjugate ports;
characterized in that:
said first transmission line is connected to one port of one pair of ports of said first coupler;
the other port of said one pair of ports of said first coupler is resistively terminated;
said first delay network is coupled to one port of the other pair of ports of said first coupler and one port of one pair of ports of said second coupler;
one port of the other pair of ports of said second coupler is connected to the input terminal of said amplifier;
the other port of the other pair of ports of said second coupler is resistively terminated;
the output terminal of said amplifier is connected to one port of one pair of ports of said third coupler;
the other port of said one pair of ports of said third coupler is resistively terminated;
said second delay network is connected to one port of the other pair of ports of said third coupler and one port of one pair of ports of said fourth coupler;
one port of the other pair of ports of said fourth coupler is connected to said second transmission line;
the other port of said other pair of ports of said fourth coupler is resistively terminated;

said other port of the other pair of ports of said third coupler is coupled to the other port of said other pair of ports of said first coupler;
and the other port of said one pair of ports of said fourth coupler is coupled to the other port of said one pair of ports of said second coupler.

* * * * *

UNITED STATES PATENT OFFICE
CERTIFICATE OF CORRECTION

Patent No. 3,638,134 Dated January 25, 1972

Inventor(s) Henry R. Beurrier and Harold Seidel

It is certified that error appears in the above-identified patent and that said Letters Patent are hereby corrected as shown below:

Col. 3, line 9, after "at" and before "the" insert --port c, produces a voltage $(1+\Gamma_2)d_1k_1k_2E_r$ at--.

Signed and sealed this 29th day of August 1972.

(SEAL)
Attest;

EDWARD M.FLETCHER,JR.
Attesting Officer

ROBERT GOTTSCHALK
Commissioner of Patents